United States Patent
Kondoh et al.

(10) Patent No.: US 11,425,823 B2
(45) Date of Patent: Aug. 23, 2022

(54) METHOD FOR PRODUCING WIRING SUBSTRATE

(71) Applicant: TOYOTA JIDOSHA KABUSHIKI KAISHA, Toyota (JP)

(72) Inventors: Haruki Kondoh, Okazaki (JP); Rentaro Mori, Kasugai (JP); Hiroshi Yanagimoto, Miyoshi (JP); Keiji Kuroda, Toyota (JP); Kazuaki Okamoto, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/339,529

(22) Filed: Jun. 4, 2021

(65) Prior Publication Data

US 2021/0392753 A1 Dec. 16, 2021

(30) Foreign Application Priority Data

Jun. 12, 2020 (JP) .............................. JP2020-102110

(51) Int. Cl.
*H05K 3/10* (2006.01)
*H05K 3/46* (2006.01)
*H05K 3/00* (2006.01)

(52) U.S. Cl.
CPC .............. *H05K 3/10* (2013.01); *H05K 3/0017* (2013.01); *H05K 3/467* (2013.01)

(58) Field of Classification Search
CPC ........ H05K 3/10; H05K 3/0017; H05K 3/467; H05K 3/108; H05K 3/00;
(Continued)

(56) References Cited

U.S. PATENT DOCUMENTS 4,326,930 A * 4/1982 Nagel ....................... C25B 9/23
205/164
4,810,332 A * 3/1989 Pan ....................... H05K 3/4647
257/E23.072
(Continued)

FOREIGN PATENT DOCUMENTS

JP 2014-185371 A 10/2014
JP 2021-048210 A 3/2021
JP 2021-066921 A 4/2021

*Primary Examiner* — Donghai D Nguyen
(74) *Attorney, Agent, or Firm* — Sughrue Mion, PLLC

(57) ABSTRACT

The present disclosure provides a method for producing a wiring substrate. A seeded substrate including an insulation substrate, a conductive undercoat layer, and a conductive seed layer provided in a first region, in that order, is first prepared. An insulation layer covering the seed layer and the undercoat layer is then formed. Subsequently, the insulation layer is etched to expose a surface of the seed layer and form a remaining insulation layer covering the undercoat layer in the second region. Subsequently, a voltage is applied between an anode and the seed layer while a solid electrolyte membrane containing a metal ion-containing aqueous solution disposed between the seed layer and the anode and the membrane and the seed layer pressed into contact with each other, thereby a metal layer being formed on the surface of the seed layer. Thereafter, the remaining insulation layer is removed and the undercoat layer is etched.

3 Claims, 12 Drawing Sheets

(58) Field of Classification Search
CPC .... H05K 2201/0338; H05K 2201/0341; Y10T 29/49155; Y10T 29/49156
USPC .................................................. 29/846, 847
See application file for complete search history.

(56) References Cited

U.S. PATENT DOCUMENTS

| | | | |
|---|---|---|---|
| 7,923,828 B2 * | 4/2011 | Endo | H05K 3/4617 257/E23.173 |
| 10,161,055 B2 * | 12/2018 | Sato | H05K 3/242 |
| 2009/0044971 A1 * | 2/2009 | Kataoka | H05K 3/365 174/257 |
| 2016/0076162 A1 | 3/2016 | Sato et al. | |
| 2021/0084774 A1 | 3/2021 | Okamoto et al. | |

* cited by examiner

METHOD FOR PRODUCING WIRING SUBSTRATE

CROSS REFERENCE TO RELATED APPLICATIONS

The present application claims priority from Japanese patent application JP 2020-102110 filed on Jun. 12, 2020, the content of which is hereby incorporated by reference into this application.

BACKGROUND

Technical Field

The present disclosure relates to a method for producing a wiring substrate.

Background Art

Conventionally, a plating method have been widely used to form a wiring in the production of a wiring substrate (i.e., a wiring board). However, the plating method requires rinsing with water after plating treatment, thereby requiring a processing of waste liquid. In order to overcome such drawback, JP 2014-185371 A discloses a method of forming a metal film including disposing a solid electrolyte membrane between an anode and a cathode (a substrate), providing a metal ion-containing solution between the anode and the solid electrolyte membrane, bringing the solid electrolyte membrane into contact with the substrate, and applying a voltage between the anode and the substrate to deposit the metal on the substrate surface.

SUMMARY

When a wiring layer with a predetermined wiring pattern is formed on an insulation substrate according to the method disclosed in JP 2014-185371 A, a metal may be deposited in a region other than the predetermined wiring pattern. The metal deposited in the region other than the predetermined wiring pattern may sometimes induce short circuits between wirings. This necessitates removal of such metal. However, it is difficult to selectively remove the metal deposited in the region other than the predetermined wiring pattern. Accordingly, it is desired to avoid metal deposition in the region other than the predetermined wiring pattern.

The present disclosure provides a method for producing a wiring substrate which allows preventing or reducing metal deposition in a region other than the predetermined wiring pattern.

An aspect of the present disclosure provides a method for producing a wiring substrate including an insulation substrate and a wiring layer having a predetermined wiring pattern and provided on the insulation substrate, the method including following steps in the sequence set forth:

(a) preparing a seeded substrate including:
the insulation substrate:
a conductive undercoat layer provided on the insulation substrate; and
a conductive seed layer provided on the undercoat layer in a first region, the first region having a predetermined pattern corresponding to the wiring pattern;

(b) forming an insulation layer covering the seed layer in the first region and covering the undercoat layer in a second region, the second region being a region other than the first region;

(c) etching the insulation layer at least in the first region to expose a surface of the seed layer and form a remaining insulation layer covering the undercoat layer in the second region;

(d) forming a metal layer on the surface of the seed layer, wherein a voltage is applied between an anode and the seed layer while a solid electrolyte membrane containing a metal ion-containing aqueous solution being disposed between the seed layer and the anode and the solid electrolyte membrane and the seed layer being pressed into contact with each other;

(e) removing the remaining insulation layer; and (f) etching the undercoat layer.

The method of the present disclosure can prevent or reduce metal deposition in the region other than the predetermined wiring pattern.

DETAILED DESCRIPTION

Figure 1:
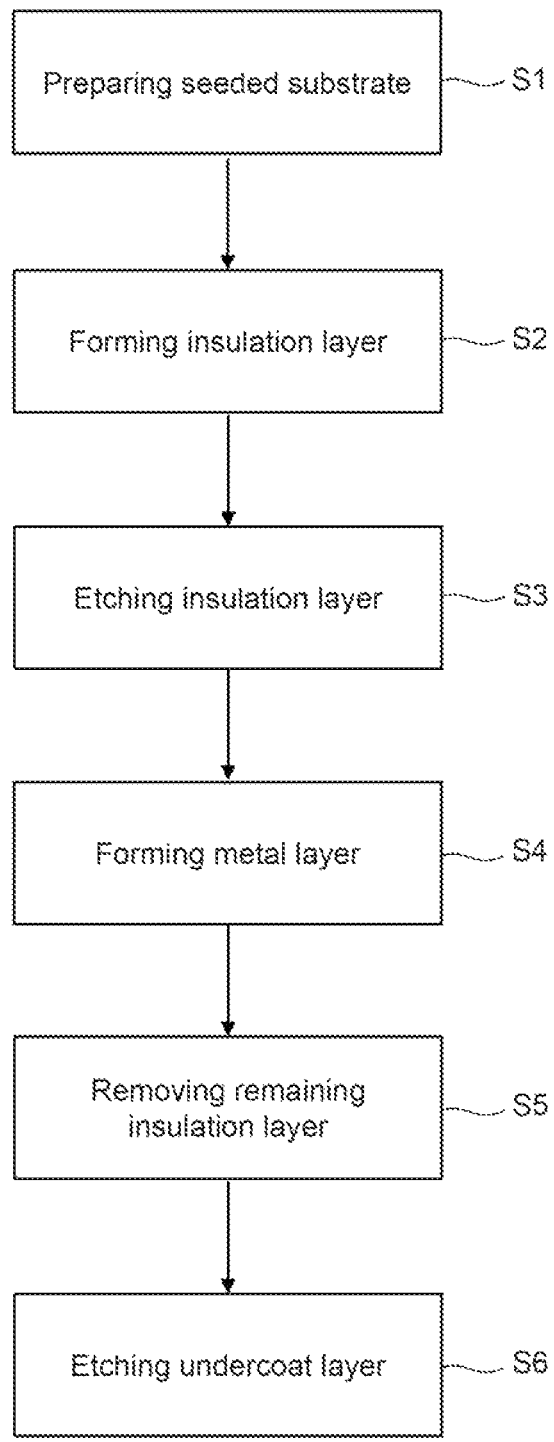
FIG. 1 is a flowchart showing a method for producing a wiring substrate according to an embodiment.

Hereafter, the embodiments of the present disclosure are described with reference to the drawings. In the drawings referred to in the following description, same reference numerals are used for the same members or members having similar functions, and their repeated descriptions may be omitted in some cases. For the convenience of description, the dimensional ratio in the drawings may be different from the actual ratio in some cases, and some members may be omitted from the drawings in some cases. In the present disclosure, the numerical range including the preposition "to" encompasses numerical values before and after the preposition "to" as the lower limit and the upper limit, respectively.

As shown in FIG. 1, a method for producing a wiring substrate according to an embodiment includes; a step of preparing a seeded substrate (S1); a step of forming an insulation layer (S2); a step of etching the insulation layer (S3); a step of forming a metal layer (S4); a step of removing a remaining insulation layer (S5); and a step of etching an undercoat layer (S6). These steps are described below.

(1) Step of Preparing Seeded Substrate (S1)

Figure 2:
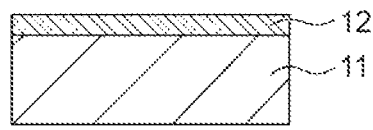
FIG. 2 is a drawing schematically illustrating a step of forming an undercoat layer.

At first, as shown in FIG. 2, the undercoat layer 12 is formed on an insulation substrate 11. The insulation substrate 11 may be, for example, a resin substrate, a glass substrate, or a substrate including resin and glass, such as a glass epoxy resin substrate. Examples of resin used for the insulation substrate 11 include: thermoplastic resin such as epoxy resin, ABS resin, AS resin, AAS resin, PS resin, EVA resin, PMMA resin, PBT resin, PET resin, PPS resin, PA resin, POM resin. PC resin, PP resin, PE resin, PI (polyimide) resin, polymer alloy resin including an elastomer and PP, modified PPO resin, PTFE resin, and ETFE resin; thermosetting resin such as phenolic resin, melamine resin, amino resin, unsaturated polyester resin, polyurethane, diallyl phthalate, silicone resin, and alkyd resin; resin including epoxy resin mixed with cyanate resin; and liquid crystal polymer. In some embodiments, the glass epoxy resin substrate may be used as the insulation substrate 11.

The undercoat layer 12 has sufficient conductivity for the formation of the metal layer 14 described later. Examples of materials that can constitute the undercoat layer 12 include: metal silicides, such as $FeSi_2$, $CoSi_2$, $MoSi_2$, $WSi_2$, $VSi_2$, $ReSi_{1.75}$, $CrSi_2$, $NbSi_2$, $TaSi_2$, $TiSi_2$, and $ZrSi_2$, in particular, transition metal silicide; conductive metal oxides, such as $TiO_2$, SnO, GeO, and ITO (indium tin oxide); Ti, Al, Cr, Si, and alloy containing at least one of Ti, Al, Cr, or Si; and conductive resin. The undercoat layer 12 may have a natural oxide film on the surface thereof. The term "natural oxide film" refers to an oxide film that is naturally formed on the surface of a substance when such substance is left to stand in the air. Examples of natural oxide films include a passive film formed on the surface of Ti, Al, Cr, or an alloy containing at least one of Ti, Al, or Cr, and an $SiO_2$ film formed on the surface of Si or silicide. From the viewpoint of in-plane uniformity of the metal layer 14 described later, the undercoat layer 12 may have a thickness of 20 nm or more. In some embodiments, the undercoat layer 12 may have a thickness of 100 μm or more. From the viewpoint of production cost, the undercoat layer 12 may have a thickness of 300 nm or less.

The undercoat layer 12 may be formed on the entire surface (a main surface) of the insulation substrate 11. The undercoat layer 12 may be formed by any method. For example, the undercoat layer 12 can be formed by PVD (physical vapor deposition) such as sputtering, CVD (chemical vapor deposition), or electroless plating.

Figure 3:
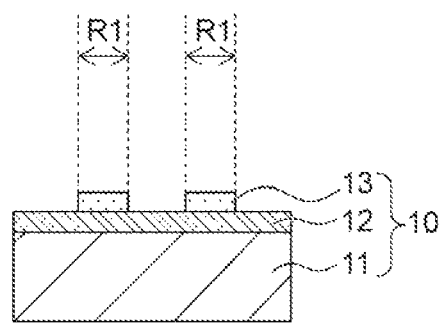
FIG. 3 is a drawing schematically illustrating a step of forming a seed layer.

Subsequently, the seed layer 13 is formed on the surface of the undercoat layer 12 in a first region R1, as shown in FIG. 3. The first region R1 has a predetermined pattern corresponding to a wiring pattern of the wiring substrate produced by the production method according to the present embodiment. The seed layer 13 is electrically connected to the undercoat layer 12.

A material constituting the seed layer 13 is not particularly limited, provided that the material is a conductive material. The material constituting the seed layer 13 may be a noble metal having high oxidation resistance. For example, the seed layer 13 may be formed of at least one metal selected from the group consisting of Pt, Pd, Rh, Cu, Ag, and Au. From the viewpoint of in-plane uniformity of the metal layer 14 described later, the seed layer 13 may have a thickness of 20 nm or more. In some embodiments, the seed layer 13 may have a thickness of 1,000 μm or more. From the viewpoint of production cost, the seed layer 13 may have a thickness of 1 μm or less. In some embodiments, the seed layer 13 may have a thickness of 300 nm or less.

The seed layer 13 may be formed by any method. For example, the seed layer 13 can be formed by applying a dispersion of metal particles to the first region R1 and solidifying the dispersion. The metal particles may include at least one metal selected from the group consisting of Pt, Pd. Rh, Cu, Ag, and Au. In order to form finer wirings, each of the metal particles may have a smaller diameter. For example, each of the metal particles may have a diameter of 1 nm to 100 nm. Each of the metal particles may also have a diameter of 20 nm or less. The metal particles having such diameters have lower melting points, which facilitates sintering of the metal particles. A dispersion medium for the dispersion may be, for example, a liquid volatilizable by heating, such as decanol. The dispersion may contain an additive. Examples of the additive include straight-chain fatty acid salts having 10 to 17 carbon atoms. Examples of methods of applicating the dispersion include printing methods such as screen printing, inkjet printing, and transfer printing. A method of solidifying the dispersion is not particularly limited. For example, heating may be applied to volatilize the dispersion medium and sinter the metal particles, thereby solidifying the dispersion.

It is also allowable to dispose a metal mask on the undercoat layer 12 and then form the seed layer 13 in the first region R1 by vacuum deposition, sputtering, or the like.

The first region R1 may consist of a single continuous region or it may include a plurality of independent regions. When the first region R1 includes a plurality of independent regions, the seed layers 13 formed in respective independent regions are electrically connected to each other by the undercoat layer 12. Thus, it is not necessary to provide each seed layer 13 in each independent region with a lead wiring, which would otherwise need to be used in the step of forming the metal layer (S4) described later.

Thus, the seeded substrate 10 including the insulation substrate 11, the conductive undercoat layer 12 provided on the insulation substrate 11, and the conductive seed layer 13 provided on the undercoat layer 12 in the first region R1 can be obtained. It is not necessary to self-manufacture the seeded substrate 10. The seeded substrate 10 prepared in advance may be purchased commercially.

(2) Step of Forming Insulation Layer (S2)

Figure 4:
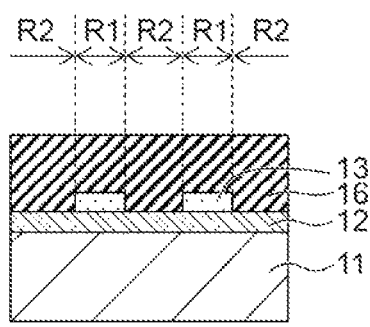
FIG. 4 is a drawing schematically illustrating a step of forming an insulation layer.

As shown in FIG. 4, the insulation layer 16 is formed on the seeded substrate 10. While the insulation layer 16 covers the seed layer 13 in the first region R1, it covers the undercoat layer 12 in a second region R2, which is a region other than the first region R1.

A material constituting the insulation layer 16 is not particularly limited, provided that the material is an insulating material. Examples of materials that can constitute the insulation layer 16 include oxides, such as $SiO_2$, $Al_2O_3$, $TiO_2$, and SiOC (a carbon-doped silicon oxide), polysilane, polysilazane, epoxy resin, and acrylate resin.

The insulation layer 16 can be formed by any method, such as CVD, sputtering, mist coating, spin coating, or dip coating. Mist coating is a method including atomizing a raw material solution containing a metal element with the use of an ultrasonic transducer to form mist, supplying the mist to the substrate, and decomposing and/or reacting the mist on a substrate surface with thermal energy or the like, thereby forming a thin film containing the metal element on the substrate surface.

The insulation layer 16 may have a thickness equal to or larger than that of the seed layer 13. In particular, the thickness of the insulation layer 16 may be larger than that of the seed layer 13 by 2.5 to 10 times. This allows the surface of the insulation layer 16 to be sufficiently flat, which facilitates forming the remaining insulation layer 16a with a thickness substantially the same as that of the seed layer 13 in the subsequent step of etching the insulation layer 16 (S3).

(3) Step of Etching Insulation Layer (S3)

Figure 5:
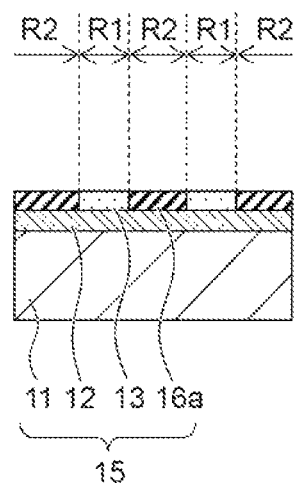
FIG. 5 is a drawing schematically illustrating a step of etching the insulation layer.

As shown in FIG. 5, the insulation layer 16 is etched to expose the surface of the seed layer 13 in the first region R1 and to form the remaining insulation layer 16a that covers the undercoat layer 12 in the second region R2. Thus, an insulation-treated substrate 15 including the insulation substrate 11, the conductive undercoat layer 12 provided on the insulation substrate 11, the conductive seed layer 13 provided on the undercoat layer 12 in the first region R1, and the remaining insulation layer 16a provided on the undercoat layer 12 in the second region R2 can be obtained.

In the present embodiment, the entire surface of the insulation layer 16 is etched without using a patterning technique. Specifically, the insulation layer 16 is etched both in the first region R1 and the second region R2. The resulting remaining insulation layer 16a may have a thickness that is substantially the same as the thickness of the seed layer 13. This allows the surface level of the seed layer 13 to be equal to that of the remaining insulation layer 16a, thereby allowing the solid electrolyte membrane 52 being pressed into contact with the surface of the seed layer 13 and that of the remaining insulation layer 16a with a pressing force of higher uniformity in the subsequent step of forming a metal layer (S4).

As described in the modified embodiment later, it is not necessary to etch the insulation layer 16 in the second region R2, and it is sufficient to etch the insulation layer 16 at least in the first region R1.

The insulation layer 16 may be etched via either dry etching or wet etching. Examples of dry etching methods include reactive gas etching, sputter etching, plasma etching, reactive ion etching (RIE), reactive ion beam etching, radical etching, photo-excited etching, laser-assisted etching, and laser ablation etching. A method of reactive ion etching can involve the use of capacitively coupled plasma (CCP), inductively coupled plasma (ICP), or microwave ECR (Electron Cyclotron Resonance) plasma. Examples of wet etching methods include chemical etching using an acid solution such as an HF solution or an alkaline solution as an etching solution and chemical mechanical polishing (CMP) performed via chemical etching in combination with mechanical polishing.

Etching gas or an etching solution used for etching may be appropriately selected depending on a material constituting the insulation layer 16. Examples of etching gas include $CF_4$, $SF_6$, boron, chlorine, HBr, and $BCl_3$. Examples of etching solutions that can be used include an acid solution such as an HF solution and an alkaline solution. When the insulation layer 16 is formed of $SiO_2$, SiOC, polysilane, or polysilazane, for example, the insulation layer 16 can be etched via reactive ion etching involving the use of $CF_4$ gas. When the insulation layer 16 is formed of $SiO_2$ or SiOC, the insulation layer 16 can be etched via wet etching using an HF solution. When the insulation layer 16 is formed of epoxy resin or acrylate resin, the insulation layer 16 can be etched via reactive ion etching using a gas mixture of $O_2/CF_4$ or a gas mixture of $O_2/SF_6/CHF_3$ or wet etching using an alkaline solution.

(4) Step of Forming Metal Layer (S4)

Figure 6:
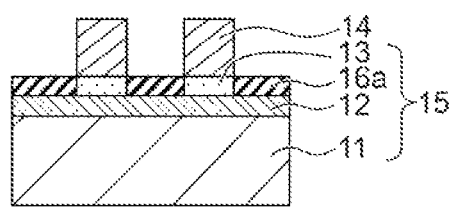
FIG. 6 is a drawing schematically illustrating a step of forming a metal layer.

As shown in FIG. 6, the metal layer 14 is formed on the surface of the seed layer 13. Examples of materials that can constitute the metal layer 14 include Cu. Ni, Ag, and Au. In some embodiments, the metal layer 14 may be formed of Cu. The metal layer 14 may have a thickness of, for example, 1 μm to 100 μm.

Figure 9:
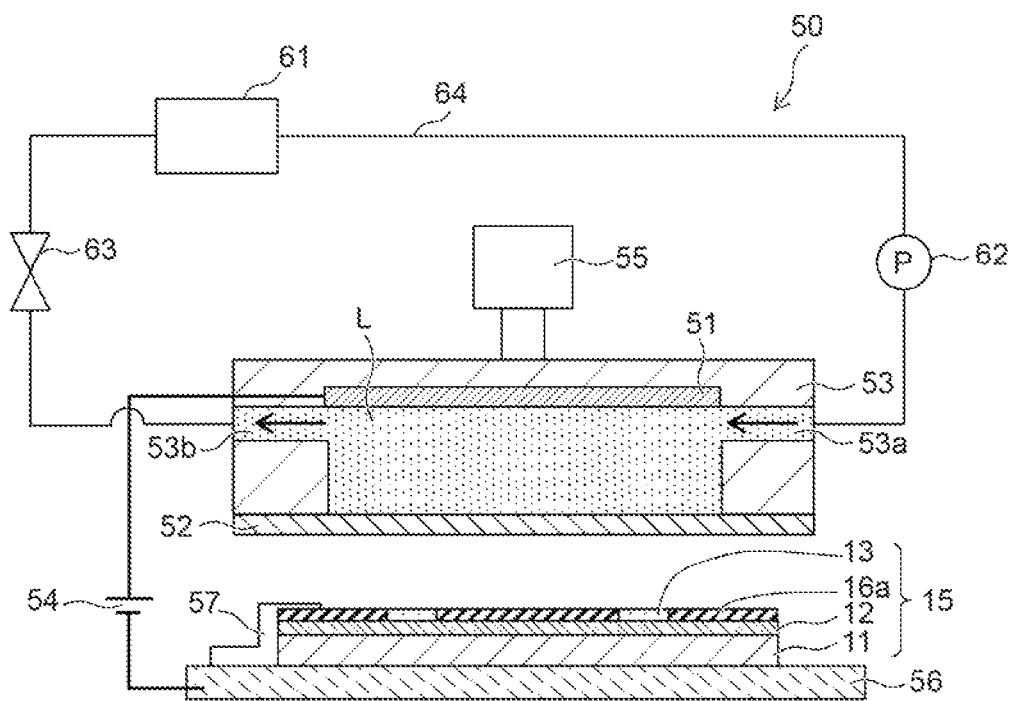
FIG. 9 is a cross-sectional view schematically illustrating a film-forming apparatus used in the step of forming the metal layer.
Figure 10:
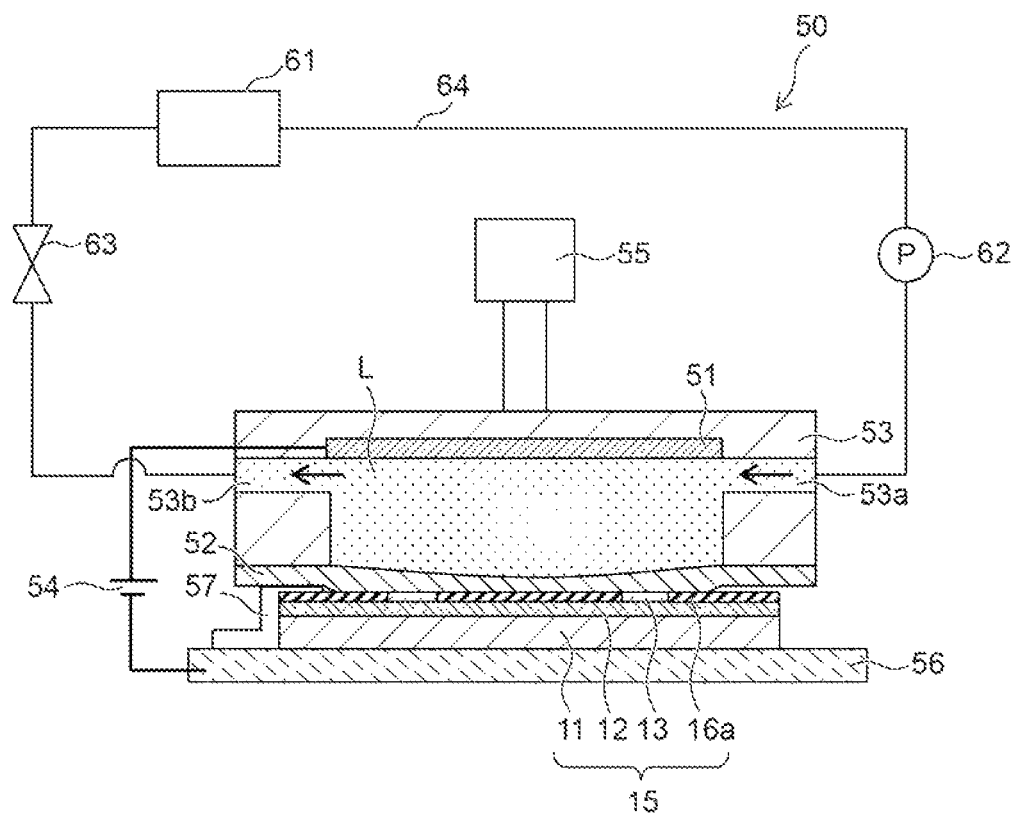
FIG. 10 is a cross-sectional view schematically illustrating the film-forming apparatus of FIG. 9 in which a housing is lowered to a predetermined level.

An example of a film-forming apparatus 50 used to form the metal layer 14 is shown in FIG. 9 and FIG. 10. The film-forming apparatus 50 includes a metal anode 51 provided to oppose the seed layer 13, a solid electrolyte membrane 52 provided between the anode 51 and the seed layer 13, and a power supply 54 that applies a voltage between the anode 51 and the seed layer 13.

The film-forming apparatus 50 further includes a housing 53. The housing 53 holds the anode 51 and an aqueous solution L containing ions of metal for constituting the metal layer 14 (hereafter, referred to as a "metal solution L") therein. As shown in FIG. 9, the housing 53 may define a space for accommodating the metal solution L between the anode 51 and the solid electrolyte membrane 52. In this case, the anode 51 may be a plate member formed of a material that is the same as the material constituting the metal layer 14 and soluble in the metal solution L (e.g., Cu) or a plate member formed of a material that is not soluble in the metal solution L (e.g., Ti). In the film-forming apparatus 50 having the space for accommodating the metal solution L between the anode 51 and the solid electrolyte membrane 52, the solid electrolyte membrane 52 can be pressed into contact with the insulation-treated substrate 15 with a uniform pressing force, which allows the metal layer 14 to be uniformly formed on the seed layer 13 over the entire surface of the insulation-treated substrate 15. Such film-forming apparatus 50 may be suitable for forming a fine wiring pattern.

The anode 51 may be in contact with the solid electrolyte membrane 52, although such configuration is not shown in the figures. In such a case, the anode 51 may be formed of a porous body through which the metal solution L can penetrate. The surface of the anode 51 opposite from the surface that is to be brought into contact with the solid electrolyte membrane 52 may be in contact with the space for accommodating the metal solution L.

Examples of materials that can constitute the solid electrolyte membrane 52 include cation-exchange resin such as fluorine resin (e.g. Nafion® from Du Pont), hydrocarbon resin, polyamic acid resin, or Selemion (CMV, CMD, and CMF series) from AGC. When the solid electrolyte membrane 52 is brought into contact with the metal solution L, the metal solution L is impregnated into the solid electrolyte membrane 52, which results in the solid electrolyte membrane 52 containing the metal solution L therein. The solid electrolyte membrane 52 may have a thickness of, for example, approximately 5 μm to approximately 200 sm.

The metal solution L contains metal which is a raw material of the metal layer 14 (e.g., Cu, Ni, Ag, or Au) in its ionic state. The metal solution L may contain nitrate ion, phosphate ion, succinate ion, sulfate ion, and/or pyrophosphate ion. The metal solution L may be an aqueous solution of metal salt, such as nitrate salt, phosphate salt, succinate salt, sulfate salt, or pyrophosphate salt.

In addition, the film-forming apparatus 50 includes a lifting and lowering device 55 that lifts or lowers the housing 53 on top of the housing 53. The lifting and lowering device 55 may include a hydraulic or pneumatic cylinder, a power-operated actuator, a linear guide, a motor, etc.

The housing 53 is provided with an inlet port 53a and an outlet port 53b. The inlet port 53a and the outlet port 53b are connected to a tank 61 by a piping 64. The metal solution L is transported from the tank 61 with the aid of a pump 62 connected to the piping 64, flows into the housing 53 through the inlet port 53a, discharged from the housing 53 through the outlet port 53b, and then returned to the tank 61. The piping 64 is provided with a pressure regulation valve 63 downstream of the outlet port 53b. With the aid of the pressure regulation valve 63 and the pump 62, a pressure of the metal solution L in the housing 53 can be regulated.

The film-forming apparatus 50 further includes a metal platform 56 on which the insulation-treated substrate 15 is disposed and a conductive member 57 that electrically connects the metal platform 56 to the undercoat layer 12 or the seed layer 13 of the insulation-treated substrate 15. The conductive member 57 may be a metal plate that covers a part of the peripheral part of the insulation-treated substrate 15 and is partially bent and brought into contact with the metal platform 56, thereby electrically connecting the metal platform 56 to the undercoat layer 12 and the seed layer 13. The conductive member 57 may be attachable to and removable from the insulation-treated substrate 15.

A negative electrode of the power supply 54 is electrically connected to the undercoat layer 12 and the seed layer 13 through the metal platform 56, and a positive electrode of the power supply 54 is electrically connected to the anode 51.

The metal layer 14 can be formed using the film-forming apparatus 50 in the manner described below.

As shown in FIG. 9, the insulation-treated substrate 15 and the conductive member 57 are disposed at predetermined positions on the metal platform 56. As shown in FIG. 10, subsequently, the housing 53 is lowered to a predetermined level with the aid of the lifting and lowering device 55.

Subsequently, the metal solution L is pressurized with the aid of the pump 62. The pressure regulation valve 63 allows the pressure of the metal solution L in the housing 53 to be maintained at a predetermined level. The solid electrolyte membrane 52 is deformed to fit and come into contact with the surface of the insulation-treated substrate 15 (i.e., the surface of the seed layer 13 and the surface of the remaining insulation layer 16a), thereby bringing the metal solution L contained in the solid electrolyte membrane 52 into contact with the surface of the seed layer 13 and the surface of the remaining insulation layer 16a. The solid electrolyte membrane 52 is uniformly pressed against the surface of the seed layer 13 and the surface of the remaining insulation layer 16a by the pressure of the metal solution L in the housing 53.

The power supply 54 applies a voltage between the anode 51 and the seed layer 13, thereby causing metal ions contained in the metal solution L in contact with the seed layer 13 to be reduced to metal on the surface of the seed layer 13 and the metal to be deposited on the surface of the seed layer 13. On the other hand, metal ions are not reduced and metals are not deposited on the surface of the remaining insulation layer 16a. Thus, the metal layer 14 is selectively formed on the surface of the seed layer 13. A voltage to be applied between the anode 51 and the seed layer 13 may be appropriately determined. Application of a higher voltage increases a metal deposition rate. In addition, the metal solution L may be heated, which also allows increase of the metal deposition rate.

After the metal layer 14 having a given thickness is formed, voltage application between the anode 51 and the seed layer 13 is terminated, and pressurization of the metal solution L by the pump 62 is terminated. The housing 53 is then lifted to a predetermined level (see FIG. 9), and the insulation-treated substrate 15 with the metal layer 14 formed thereon is then removed from the metal platform 56.

(5) Step of Removing Remaining Insulation Layer (S5)

Figure 7:
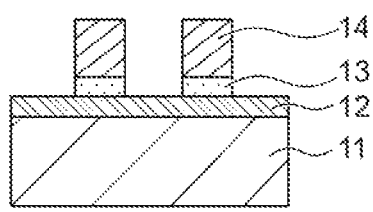
FIG. 7 is a drawing schematically illustrating a step of removing a remaining insulation layer.

As shown in FIG. 7, the remaining insulation layer 16a (see FIG. 6) is removed. The remaining insulation layer 16a can be removed via etching.

The remaining insulation layer 16a may be etched via either dry etching or wet etching. Examples of dry etching methods include reactive gas etching, sputter etching, plasma etching, reactive ion etching (RIE), reactive ion beam etching, radical etching, photo-excited etching, laser-assisted etching, and laser ablation etching. A method of reactive ion etching can involve the use of capacitively coupled plasma (CCP), inductively coupled plasma (ICP), or microwave ECR (Electron Cyclotron Resonance) plasma.

Etching gas or an etching solution used for etching of the remaining insulation layer 16a may be appropriately selected depending on a material constituting the remaining insulation layer 16a. Examples of etching gas include $CF_4$, $SF_6$, boron, chlorine, HBr, and $BCl_3$. Examples of etching solutions that can be used include an acid solution such as an HF solution and an alkaline solution. When the remaining insulation layer 16a is formed of $SiO_2$, SiOC, polysilane, or polysilazane, for example, the remaining insulation layer 16a can be etched via reactive ion etching involving the use of $CF_4$ gas. When the remaining insulation layer 16a is formed of $SiO_2$ or SiOC, the remaining insulation layer 16a can be etched via wet etching using an HF solution. When the remaining insulation layer 16a is formed of epoxy resin or acrylate resin, the remaining insulation layer 16a can be etched via reactive ion etching using a gas mixture of $O_2/CF_4$ or a gas mixture of $O_2/SF_6/CHF_3$ or wet etching using an alkaline solution.

(6) Step of Etching Undercoat Layer (S6)

Figure 8:
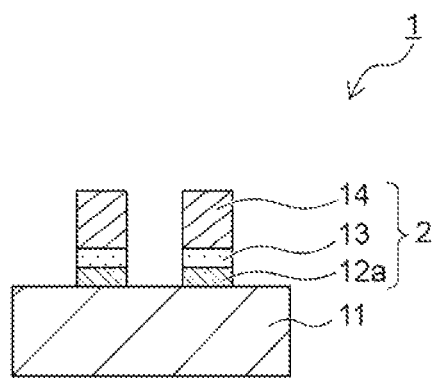
FIG. 8 is a drawing schematically illustrating a step of etching the undercoat layer.

As shown in FIG. 8, subsequently, the undercoat layer 12 (see FIG. 7) is etched. In the etching of the undercoat layer 12, the metal layer 14 serves as a mask. Thus, a part 12a of the undercoat layer 12 underneath the metal layer 14 (hereafter, referred to as a "remaining undercoat layer 12c") remains on the insulation substrate 11 without being etched. As a result, a wiring layer 2 including the remaining undercoat layer 12a, the seed layer 13, and the metal layer 14 and having the predetermined wiring pattern is formed on the insulation substrate 11.

Etching gas or an etching solution used for etching of the undercoat layer 12 may be appropriately selected depending on a material constituting the undercoat layer 12. Examples of etching gas include $CF_4$, $SF_6$, boron, chlorine, HBr, and $BCl_3$. Examples of etching solutions that can be used include an acid solution such as an HF solution and an alkaline solution. When the undercoat layer 12 is formed of silicide, for example, the undercoat layer 12 can be etched via reactive ion etching involving the use of $CF_4$ gas.

By the process as described above, the wiring substrate 1 including the insulation substrate 11 and the wiring layer 2 having the predetermined wiring pattern provided on the insulation substrate 11 is produced.

In the present embodiment the remaining insulation layer 16a formed in the second region R2 allows selective deposition of metal on the surface of the seed layer 13 in the step of forming the metal layer 14 (S4) as described above. In other words, the remaining insulation layer 16a formed in the second region R2 allows prevention or reduction of metal deposition in a region other than the predetermined wiring pattern (i.e., the second region R2).

According to an intensive examination by the inventors, without the remaining insulation layer 16a in the second region R2, metals may be disadvantageously deposited in the second region R2 upon applying a higher voltage or heating the metal solution L in the step of forming the metal layer 14 (S4). In the method of production according to the present embodiment, however, the remaining insulation layer 16a formed in the second region R2 can prevent or reduce such unintended metal deposition. This allows applying a high voltage and/or heating the metal solution L in the step of forming the metal layer 14 (S4), thereby increasing the metal deposition rate and shortening the duration of production of the wiring substrate 1.

In the production method according to the present embodiment, the wiring substrate 1 can be produced without the use of a resist mask. This allows reduction of the cost for production and shortening of the duration of production of the wiring substrate 1.

The embodiments of the present disclosure are described in detail above. It should be noted that the present disclosure is not limited to the embodiments described above and that various design modifications may be made without departing from the spirit and scope of the present disclosure described in the claims.

For example, modifications described below may be made. In a modified embodiment described below, the matters different from those in the embodiments above are selectively described, and description concerning the matters similar to those in the embodiments above is omitted.

Figure 11:
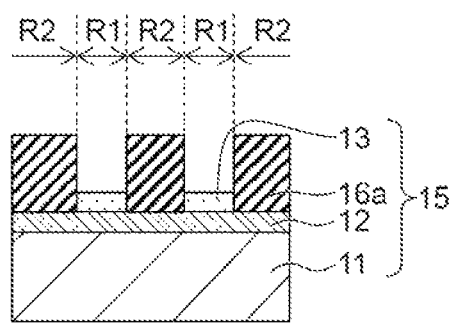
FIG. 11 is a drawing schematically illustrating a step of etching an insulation layer in a method for producing a wiring substrate according to a modified embodiment.

In a method for producing a wiring substrate according to the modified embodiment, the insulation layer 16 (see FIG. 4) in the first region R1 is selectively etched to form the remaining insulation layer 16a in the second region R2 in the step of etching the insulation layer (S3) as shown in FIG. 11. The insulation layer 16 may be etched via laser processing. Additionally, etching of the insulation layer 16 may be followed by sintering of the undercoat layer 12 and the seed layer 13 via laser irradiation, which allows improvement of adhesion between the undercoat layer 12 and the seed layer 13.

Figure 12:
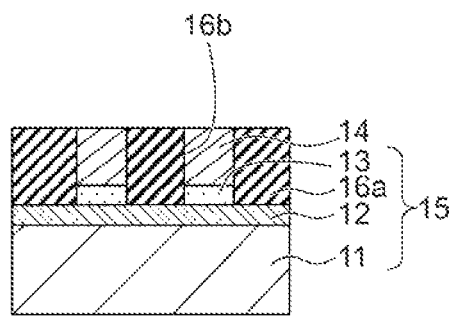
FIG. 12 is a drawing schematically illustrating a step of forming a metal layer in the method for producing the wiring substrate according to the modified embodiment.

In the step of forming a metal layer (S4), subsequently, the metal layer 14 is formed in the same manner as in the embodiments above. In the present modified embodiment, the metal layer 14 grows along a lateral surface 16b of the remaining insulation layer 16a as shown in FIG. 12. Specifically, growth of the metal layer 14 in the lateral direction (the direction parallel to the surface of the insulation substrate 11) is suppressed by the remaining insulation layer 16a. This allows accurate regulation of the width of the resulting metal layer 14.

In the present modified embodiment, an adhesive-backed insulation film may be adhered to the seeded substrate 10 to form the insulation layer 16 in the step of forming an insulation layer (S2). In such a case, the remaining insulation layer 16a in the form of film can be removed by peeling it off in the step of removing the remaining insulation layer 16a (S5). Even if the deposited metals adhere to the remaining insulation layer 16a in the step of forming the metal layer 14 (S4), peeling off the remaining insulation layer 16a can cause the deposited metals to be peeled off and removed together with the remaining insulation layer 16a. After the remaining insulation layer 16a is peeled off, plasma treatment may be carried out to remove an adhesive remaining on the surface of the undercoat layer 12. The insulation film used as the insulation layer 16 may have a thickness of, for example, 15 to 20 μm.

EXAMPLES

Hereafter, the present disclosure is specifically described with the examples, but the present disclosure is not limited to these examples.

Example 1

A glass substrate was prepared as an insulation substrate. On the surface of the insulation substrate, a $WSi_2$ layer with a thickness of 300 nm was formed as an undercoat layer via sputtering. Subsequently, a Cu layer with a thickness of 300 nm and a predetermined pattern was formed as a seed layer on the surface of the undercoat layer by screen printing with the use of an ink containing copper nanoparticles. Thus, the seeded substrate was obtained.

Polysilazane was applied to the seeded substrate via mist coating to form an insulation layer that covers the seed layer and the undercoat layer.

The entire insulation layer was subjected to etching via ion milling to expose the surface of the seed layer. The insulation layer remained on the undercoat layer, and the surface of the undercoat layer was not exposed.

With the use of the film-forming apparatus 50 shown in FIG. 9 and FIG. 10, a Cu layer was formed as a metal layer on the surface of the seed layer under the conditions described below.

Cathode: seed layer

Anode: oxygen-free copper wire

Solid electrolyte membrane: Nafion® (thickness: approximately 8 μm)

Metal solution: 1.0 mol/l of copper sulfate aqueous solution

Pressure for pressing the solid electrolyte membrane against the seed layer: 1.0 MPa Voltage applied: 0.5 V Current density: 0.23 $mA/cm^2$ Subsequently, the remaining insulation layer on the undercoat layer was removed via capacitively coupled plasma etching using $CF_4$ gas. In addition, the undercoat layer was subjected to capacitively coupled plasma etching using $CF_4$ gas with the metal layer serving as a mask until the surface of the insulation substrate was exposed. As a result, a wiring layer having a predetermined wiring pattern and consisting of the remaining undercoat layer, the seed layer, and the metal layer was formed on the insulation substrate. A wiring substrate including the insulation substrate and the wiring layer was thus obtained.

Example 2

A wiring substrate was prepared in the same manner as in Example 1, except that epoxy acrylate was applied to the seeded substrate via dip coating to form the insulation layer that covers the seed layer and the undercoat layer and that the remaining insulation layer on the undercoat layer was removed using a gas mixture of $O_2/CF_4$.

Example 3

A wiring substrate was prepared in the same manner as in Example 1, except that $SiO_2$ was deposited on the seeded substrate via CVD to form the insulation layer that covers the seed layer and the undercoat layer.

Example 4

A wiring substrate was prepared in the same manner as in Example 1, except that $SiO_2$ was deposited on the seeded substrate via sputtering to form the insulation layer that covers the seed layer and the undercoat layer.

Comparative Example

A wiring substrate was prepared in the same manner as in Example 1, except that the insulation layer was not formed and etching of the insulation layer was not performed.

Evaluation

The wiring substrate of Comparative Example was observed under a microscope (magnification: 100×). Deposition of Cu was observed in a region other than the region corresponding to the wiring pattern. Specifically, a Cu layer that was not included in the wiring layer was observed. On the basis of the microscopic image, a proportion of the area of the Cu layer that was not included in the wiring layer to the area of the region other than the region corresponding to the wiring pattern was calculated using an image analysis software "WinROOF", resulting in 1%.

The wiring substrates of Examples 1 to 4 were observed under a microscope in the same manner. Deposition of Cu was not observed in a region other than the region corresponding to the wiring pattern.

What is claimed is:

1. A method for producing a wiring substrate comprising an insulation substrate and a wiring layer having a predetermined wiring pattern and provided on the insulation substrate, the method comprising the following steps, in the sequence set forth, of:
   (a) preparing a seeded substrate comprising:
      the insulation substrate;
      a conductive undercoat layer provided on the insulation substrate; and
      a conductive seed layer provided on the undercoat layer in a first region, the first region having a predetermined pattern corresponding to the wiring pattern;
   (b) forming an insulation layer covering the seed layer in the first region and covering the undercoat layer in a second region, the second region being a region other than the first region;
   (c) etching the insulation layer at least in the first region to expose a surface of the seed layer and form a remaining insulation layer covering the undercoat layer in the second region;
   (d) forming a metal layer on the surface of the seed layer, wherein a voltage is applied between an anode and the seed layer while a solid electrolyte membrane containing a metal ion-containing aqueous solution being disposed between the seed layer and the anode and the solid electrolyte membrane and the seed layer being pressed into contact with each other;
   (e) removing the remaining insulation layer; and
   (f) etching the undercoat layer.

2. The method according to claim 1, wherein the insulation layer in the first region and the insulation layer in the second region are both etched in the step (c).

3. The method according to claim 1, wherein the insulation layer in the first region is selectively etched in the step (c).

* * * * *